(12) United States Patent
Michalewicz

(10) Patent No.: US 8,552,358 B2
(45) Date of Patent: Oct. 8, 2013

(54) QUANTUM TUNNELING PHOTODETECTOR ARRAY INCLUDING ELECTRODE NANO WIRES

(76) Inventor: Marek T. Michalewicz, Singapore (SG)

( * ) Notice: Subject to any disclaimer, the term of this patent is extended or adjusted under 35 U.S.C. 154(b) by 478 days.

(21) Appl. No.: 12/809,045

(22) PCT Filed: Dec. 18, 2007

(86) PCT No.: PCT/SG2007/000433
§ 371 (c)(1),
(2), (4) Date: Nov. 10, 2010

(87) PCT Pub. No.: WO2009/078809
PCT Pub. Date: Jun. 25, 2009

(65) Prior Publication Data
US 2011/0079706 A1    Apr. 7, 2011

(51) Int. Cl.
*H01J 3/14* (2006.01)
*H01J 5/16* (2006.01)
(52) U.S. Cl.
USPC .................. 250/214.1; 250/216; 257/431
(58) Field of Classification Search
USPC ......... 250/214.1, 214 R, 208.2, 216; 257/431
See application file for complete search history.

(56) References Cited

U.S. PATENT DOCUMENTS

| | | | |
|---|---|---|---|
| 4,903,101 A | 2/1990 | Maserjian | |
| 4,970,395 A | 11/1990 | Kruse, Jr. | |
| 6,346,431 B1* | 2/2002 | Yoo et al. | 438/94 |
| 6,809,308 B2 | 10/2004 | Yonezawa et al. | |
| 6,815,716 B2 | 11/2004 | Sanson et al. | |
| 6,967,345 B1 | 11/2005 | Gunapala et al. | |
| 6,979,825 B1 | 12/2005 | Choi | |
| 7,893,429 B2 | 2/2011 | Okada et al. | |
| 2002/0175273 A1* | 11/2002 | Moddel et al. | 250/214 R |
| 2003/0222203 A1* | 12/2003 | Sun et al. | 250/214.1 |
| 2005/0231855 A1 | 10/2005 | Tran | |
| 2007/0152558 A1 | 7/2007 | Song et al. | |
| 2007/0258147 A1 | 11/2007 | Van Der Boom et al. | |

FOREIGN PATENT DOCUMENTS

| | | |
|---|---|---|
| JP | 56-111273 A | 9/1981 |
| JP | 63-102380 A | 5/1988 |
| JP | 3-237769 A | 10/1991 |
| JP | 2001-284631 A | 10/2001 |
| JP | 2005-268243 A | 9/2005 |
| JP | 2008-254942 A | 10/2008 |
| JP | 2008-539448 A | 11/2008 |
| JP | 2009-508504 A | 3/2009 |
| WO | WO-96/10194 | 4/1996 |
| WO | WO 96/16449 | 5/1996 |
| WO | WO 2006/085319 A2 | 8/2006 |
| WO | WO 2006/103863 A1 | 10/2006 |

OTHER PUBLICATIONS

Communication in EP Appln No. 07 852 299.2 dated Nov. 15, 2011.

(Continued)

*Primary Examiner* — Francis M Legasse, Jr.
(74) *Attorney, Agent, or Firm* — Foley & Lardner LLP

(57) ABSTRACT

A quantum tunneling photodetector array and a method of generating an image. The photodetector array comprises an array of pairs of opposing first and second electrodes; a photosensitive insulating material disposed between the opposing first and second electrodes of the respective pairs; an electrical circuit for detecting photo-assisted quantum tunneling currents between the opposing first and second electrode of the respective pairs.

18 Claims, 4 Drawing Sheets

(56) References Cited

OTHER PUBLICATIONS

Communication (Supplementary European Search Report) in EP 07 85 2299 dated Jan. 19, 2011.

International Search Report received in Mar. 3, 2008 for International Application No. PCT/SG2007/000433 (3 pgs).
Notification of Reasons for Refusal Japanese Patent Application No. 2010-539391 dated Dec. 25, 2012.

* cited by examiner

QUANTUM TUNNELING PHOTODETECTOR ARRAY INCLUDING ELECTRODE NANO WIRES

FIELD OF INVENTION

The present invention relates broadly to quantum tunneling photodectector array and to a method of generating an image.

BACKGROUND

The demand for image sensors such as charge coupled device (CCD) and complimentary metal-oxide-semiconductor (CMOS) sensors has increased significantly in recent years, primarily due to increasing demand in optical devices such as camera cell phones and digital still and video cameras.

Furthermore, with the ongoing development of more and more consumer devices which incorporate cameras, such as embedded cameras in personal computers (PCs) and especially in notebook PCs, or in automotive rear view cameras, together with the ongoing boom in camera phone and personal assistant (PA) devices, the demand for imaging sensors is expected to continue to grow in the years to come.

It is with the knowledge of this background that the present invention has been made, and example embodiments of the present invention seek to provide an alternative image sensor and a method of generating an image in view of the ongoing and increasing demand for image sensors.

SUMMARY

In accordance with a first aspect of the present invention, there is provided a quantum tunneling photodetector array comprising an array of pairs of opposing first and second electrodes; a photo-sensitive insulating material disposed between the opposing first and second electrodes of the respective pairs; and electrical circuit for detecting photo-assisted quantum tunneling currents between the opposing first and second electrode of the respective pairs.

A separation distance between the first and second electrodes may be substantially fixed.

The opposing first and second electrodes may be supported on a first substrate and a second substrate respectively.

The insulating material may be disposed between the first and second substrates.

The insulating material may comprise a soft matter material.

The soft matter material may comprise one or more of a group consisting of thiols, self assembled monolayers (SAMs), organic solvents, perfluoropolyether PFPE, organic solvents, and polymeric brushes.

The insulating material may comprise a solid state material.

The solid state material may comprise one or more of a group consisting of a dielectric material, or a doped heterostructure double well barrier such as $Al_xGa_{1-x}As/GaAs/Al_xGa_{1-x}As$.

At least one of the first and second substrates may be transparent.

The photodetector array may further comprise spacer elements maintaining the substantially fixed separation distance and between the first and second electrodes.

The spacer elements may further maintain a parallelism of the pairs of first and second electrodes.

The spacer elements may be formed as separate solid state material spacers or are incorporated into the photo-sensitive material.

The array of opposing first and second electrodes may comprise a cross-grid of a first set of electrode wires and a second set of electrode wires, such that the first and second electrodes are constituted as opposing sections of the electrode wires of the first and second sets at projected crosspoints of the cross-grid.

The first and second sets of electrode wires may be disposed at about 90° with respect to each other.

The electrical circuit may comprise individual electrical connections to the electrode wires of the first and second sets.

The electrical circuit may further comprise a multiplexer component for de-multiplexing electrical signals from the first and second sets of electrode wires for detecting the quantum tunneling currents between the opposing sections of the electrode wires of the first and second sets.

The array of opposing first and second electrodes may be constituted as first and second sets of pixel electrodes respectively.

The electrical circuit may comprise individual electrical connections to the pixel electrodes of the first and second sets.

The electrical circuit may further comprise a source for applying a potential difference across the first and second opposing electrodes.

In accordance with a second aspect of the present invention, there is provided a method of generating an image comprising using a quantum tunneling photodetector array as defined in the first aspect.

In accordance with a third aspect of the present invention, there is provided a method of generating an image comprising the steps of detecting photo-assisted quantum tunneling currents between opposing first and second electrodes of respective ones of an array of pairs of the opposing first and second electrodes; and generating the image based on the respective detected photo-assisted tunneling currents between the opposing first and second electrodes.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Figure 1:
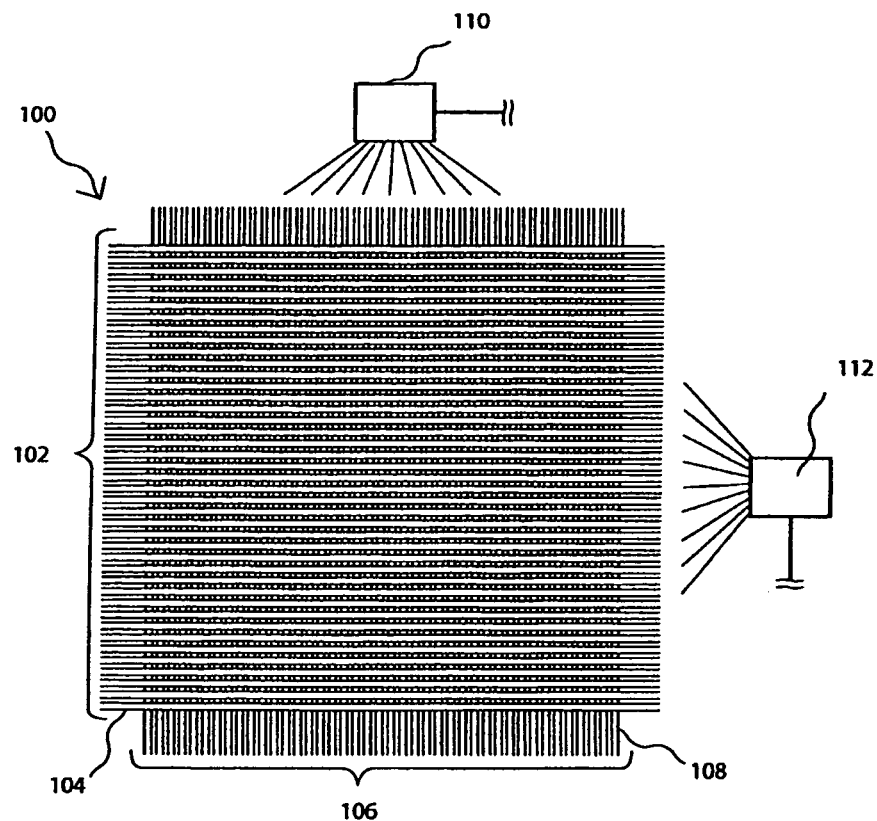
FIG. 1 shows a schematic plane view diagram illustrating a quantum tunneling photodetector array according to an example embodiment.

FIG. 1 shows a plane view of a quantum tunneling photodetector array 100 according to an example embodiment. The array 100 comprises a first set 102 of electrode wires here in the form of nano wires e.g. 104. A second set 106 of electrode wires in the form of nano wires e.g. 108 is disposed at about 90° with respect to the first set 102, thus forming a cross-grid of nano wires. The nano wires e.g. 104, 108 of the first and second sets 102, 106 respectively are disposed with a fixed separation distance therebetween, i.e. the sets 102 and 106 are at a fixed separation distance along an axis perpendicular to the plane of the drawing in FIG. 1. Out of many possible fabrication processes for the formation of nano wires on e.g. carrier substrates, reference is made to for example L-R. Hackett, Jr., Process and mask for ion beam etching of fine patterns, U.S. Pat. No. 4,275,286 and J. R. Heath and M. A. Ratner, Molecular Electronics, Physics Today, May 2003, pp. 43-49 for description of example fabrication techniques suitable for use in example embodiments of the present invention.

Electric circuit components 110, 112 are provided, and are electrically interconnected into individual ones of the nano wires e.g. 108, 104 of the second and first set 106, 102 respectively. The electrical circuit components 110, 112 are controlled to apply a potential difference between the nano wires e.g. 104, 108 of the first and second sets 102, 106, to read tunneling currents flowing between projected cross-over points of the grid, and to determine which projected cross-over point was struck by light as described below.

Figure 2:
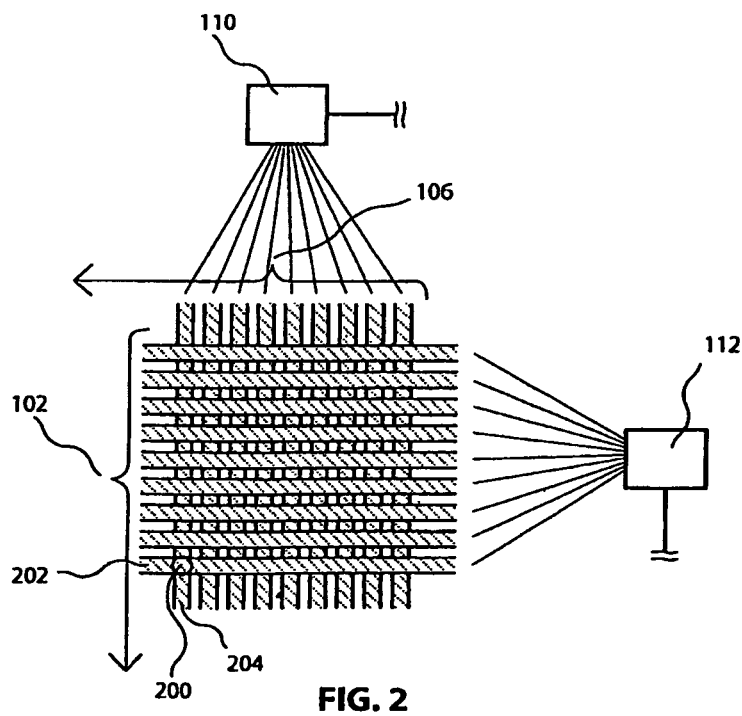
FIG. 2 shows a detail of the quantum tunneling photodetector array of FIG. 1.

Turning now to FIG. 2, which shows a detail of the quantum tunneling photodetector array 100, it will be appreciated by a person skilled in art that the cross-grid of the first and second sets 102, 106 of nano wires constitutes an array of opposing first and second electrodes in the formed of opposing sections e.g. 200 of the nano wire e.g. 202 and a corresponding opposing section (hidden in FIG. 2) of the nano wire 204 at projected cross-points of the cross-grid.

The electrical circuit components 110, 112 are additionally configured to function as a multiplexer for de-multiplexing electrical signals from the nano wires e.g. 202, 204 of the first and second sets 102, 106 for detecting photo-assisted quantum tunneling currents between the opposing sections of the nano wires e.g. 202, 204 at the projected cross-points of the cross-grid. are understood in the art, and will not be described herein in more detail. Out of many possible multiplexer components and techniques for interrogating a network of sensing lines in a cross-grid arrangement, reference is made to for example P. J. Kuekes, R. S. Williams, Demultiplexer for a molecular wire crossbar network (MWCN DEMUX) U.S. Pat. No. 6,256,767 for description of an example multiplexer components and techniques suitable for use in example embodiments of the present invention.

Figure 3:
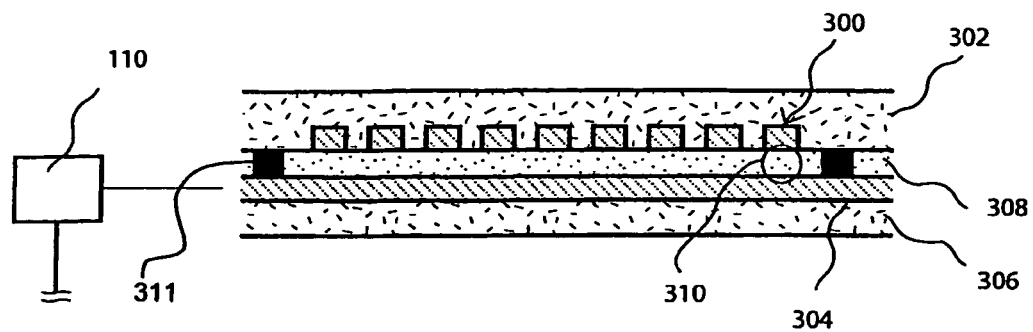
FIG. 3 shows a schematic cross-sectional view of the quantum tunneling photodetector array of FIG. 1.

Details of the operation of the example embodiment will now be described with reference to FIGS. 3 and 4. FIG. 3 shows a cross-sectional view of the quantum tunneling photodetector array 100 of the example embodiment. The first set 102 of nano wires e.g. 300 is embedded in a transparent substrate 302. In this example embodiment, the second set 106 of nano wires e.g. 304 is also embedded in a transparent substrate 306. However, it is noted that in different example embodiments, only one of the sets 102, 106 of nano wires may be embedded in a transparent material, while the other set can be embedded in an opaque material substrate.

In the example embodiment, the transparent substrates 302, 306 can comprise glass substrates, but it will be appreciated that different transparent materials can be used in different embodiments, including, but not limited to quartz, sapphire transparent oxides (TOX), semiconductor materials such as silicon or insulating or semiconducting oxides. The choice of material can also depend on the relevant wavelength of interest.

It is noted here that the example embodiment is not limited to operation in the visible wavelength range, but can be adapted to different wavelength ranges, including an infrared (IR) wavelength range or ultra-violet.

An insulating material 308 is disposed between the substrate 302, 306, in the fixed separation distance gap between the first and second sets 102, 106 of nano wires. The insulating material 308 is chosen to have photo-sensitive properties, more particular the material 308 is chosen such that photo-assisted quantum tunneling can be achieved between the nano wires of the first and second sets 102, 106 at opposing sections of the nano wires e.g. 300, 304 at projected cross-points e.g. 310 of the cross-grid.

Figure 4:
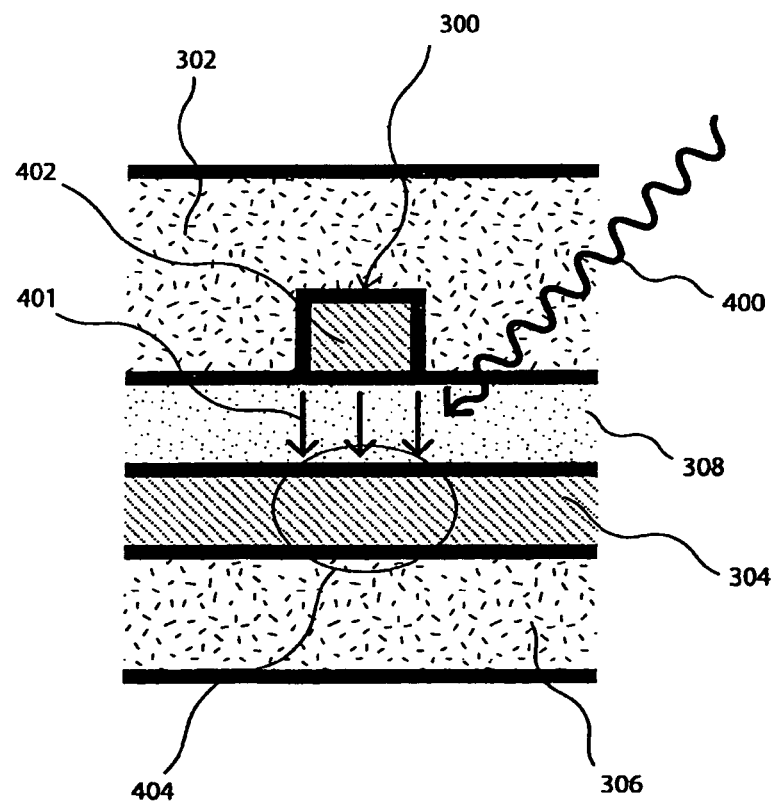
FIG. 4 shows a detail of FIG. 3, illustrating photo-assisted tunneling in the quantum tunneling photodetector array of the example embodiment.

FIG. 4 shows a detail of FIG. 3. In operation, photons 400 entering the photo-sensitive material 308 interact with the photo-sensitive material 308 to achieve photo-assisted quantum tunneling 401 between opposing sections 402, 404 of nano wires 300, 304 of the first and second sets of nano wires respectively. As described above with reference to FIG. 1, the electrical circuit components e.g. 110 are configured for applying a potential difference across the nano wires e.g. 300, 304 of the first and second sets of nano wires, and for de-multiplexing electrical signals from the nano wires e.g. 300, 304 of the first and second sets for detecting the quantum tunneling currents between the opposing sections 402, 404 of the nano wires 300, 304.

Figure 5:
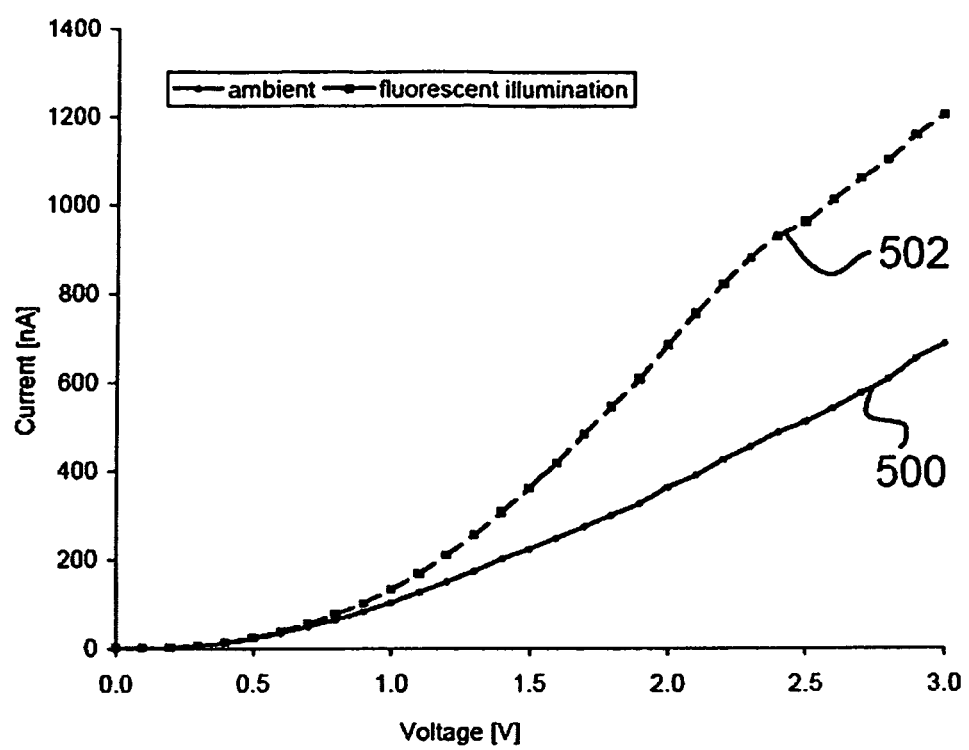
FIG. 5 shows an example plot of quantum tunneling current as a function of potential difference, illustrating a comparison between measurements in an ambient illumination and with fluorescent light illumination.

FIG. 5 shows an example plot of quantum tunneling current as a function of potential difference, illustrating a comparison between measurements in an ambient illumination (curve 500) and with fluorescent light illumination (502). As can be seen from a comparison of curves 500 and 502, the effect of photo-assisted quantum tunneling is evidenced by the increase in measured tunneling current at a given applied potential difference. Example embodiments of the present invention exploit the photo-assisted quantum tunneling effect to sense photons or optical signals at the various projected cross-points of the cross-grid of nano wires for implementation of image sensors. As will be appreciated by a person skilled in the art, e.g. threshold based signal processing, or analog (spectral) signal processing can be performed in example embodiments, to generate an image detected by the quantum tunneling photodetector array. Threshold based signal processing and analog (spectral) signal processing are understood in the art, and will not be described herein in more detailed.

Returning now to FIG. 4, the photo-sensitive material 308 in the example embodiment can comprise thiol. However, it will be appreciated that different photo-sensitive materials can be used in different embodiments. Furthermore, the photo-sensitive material 308 may be a soft matter material, or a solid state material in different embodiments. Examples of suitable photo-sensitive materials include, but are not limited to, thiols, self assembled monolayers (SAMs), organic solvents, perfluoropolyether (PFPE), or solid state materials such as a doped heterostructure double well barrier such as $Al_xGa_{1-x}As/GaAs/Al_xGa_{1-x}As$ or dielectric materials as used in Resonant Tunneling Diodes (RTD), see for example H. Mizuta and T. Tanoue, The Physics and Applications of Resonant Tunneling Diodes, Cambridge U.P., 1995. The deposition of such photo-sensitive materials is understood in the art, and will not be described herein in more detail.

The fixed separation distance and two-dimensional parallelism between substrates 302 and 306 with embedded nanowire arrays 102 and 106 is chosen such that tunneling current can flow between the projected nanowire cross-over points e.g 310. In embodiments in which the photo-sensitive material 308 is a soft matter material, separate solid state spacers e.g. 311 can be used to keep the separation distance fixed and the substrates 302, 306 parallel. Solid state, e.g. oxide, spacers 311 can be fabricated on one or both substrates 302, 306, outside the nanowire arrays 102, 106 areas.

Alternatively, molecular species that can provide structural stiffness may be incorporated into the soft matter material. For example, carbon bucky-balls $C_{60}$ or other suitable species can be provided in solution in the soft matter material.

In embodiments in which the photo-sensitive material 308 is a solid state material, the separation distance can be kept fixed and the substrates 302, 306 can be kept parallel through the structural integrity of the solid state material itself, and/or through use of separate spacers e.g. 311 between the substrates 302 and 306.

Figure 6:
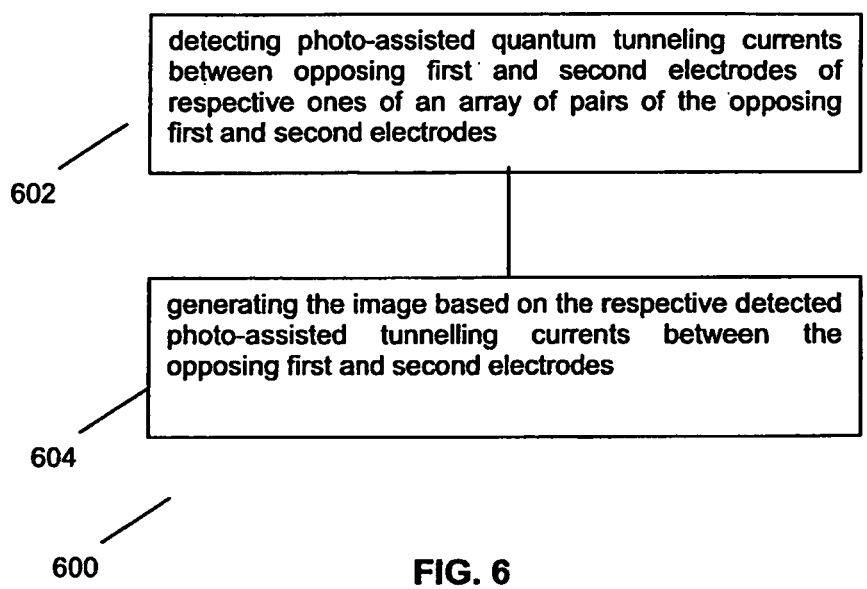
FIG. 6 shows a flow chart illustrating a method of generating an image according to an example embodiment.

FIG. 6 shows a flow chart 600 illustrating a method of generating an image according to an example embodiment. At step 602, photo-assisted quantum tunneling currents between opposing first and second electrodes of respective ones of an array of pairs of the opposing first and second electrodes are detected. At step 604, the image is generated based on the respective detected photo-assisted tunneling currents between the opposing first and second electrodes.

The example embodiments described have applications as image sensors in various optical devices, including, but not limited to, camera cell phones, camera PA devices, digital still cameras, digital video cameras, embedded cameras in PCs, automotive rear view cameras or night vision cameras. The example embodiments can provide image sensors with operating voltages suitable for hand-held, battery operated devices, for example in the range from about 0 to 25 volts, and with low power consumption, for example in the milli Watt range.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

For example, it will be appreciated that the sets of electrode wires in the cross-grid may be disposed at different, non-zero angles with respect to each other, other than the about 90° described for the example embodiment. Furthermore, the present invention is not limited to implementation with sets of electrode wires. Rather, in different embodiments the array of pairs of opposing first and second electrode elements can be implemented using two opposing sets of pixel electrode arrays. In such embodiments, the electrical circuit for detecting the photo-assisted quantum tunneling current between the opposing first and second pixel electrodes comprises individual electrical connections to the pixel electrodes, for pixelised image sensing similar to CCD or CMOS based image sensors.

The invention claimed is:

1. A quantum tunneling photodetector array comprising:
   an array of pairs of opposing first and second electrodes, the array of opposing first and second electrodes comprising a cross-grid of a first set of electrode nano wires and a second set of electrode nano wires, such that the first and second electrodes are constituted as opposing sections of the electrode nano wires of the first and second sets at projected cross-points of the cross-grid;
   a photo-sensitive insulating material disposed between the opposing first and second electrodes of the respective pairs; and
   an electrical circuit for detecting photo-assisted quantum tunneling currents between the opposing first and second electrode of the respective pairs.

2. The photodetector array as claimed in claim 1, wherein a separation distance between the first and second electrodes is substantially fixed.

3. The photodetector array as claimed in claim 1, wherein the opposing first and second electrodes are supported on a first substrate and a second substrate respectively.

4. The photodetector array as claimed in claim 1, wherein the first and second sets of electrode wires are disposed at about 90° with respect to each other.

5. The photodetector array as claimed in claim 1, wherein the electrical circuit comprises individual electrical connections to the electrode wires of the first and second sets.

6. The photodetector array as claimed in claim 1, wherein the electrical circuit further comprises a source for applying a potential difference across the first and second opposing electrodes.

7. A method of generating an image comprising using a quantum tunneling photodetector array as claimed in claim 1.

8. The photodetector array as claimed in claim 2, further comprising spacer elements maintaining the substantially fixed separation distance and between the first and second electrodes.

9. The photodetector array as claimed in claim 3, wherein the insulating material is disposed between the first and second substrates.

10. The photodetector array as claimed in claim 3, wherein at least one of the first and second substrates is transparent.

11. The photodetector array as claimed in claim 9, wherein the insulating material comprises a soft matter material.

12. The photodetector array as claimed in claim 9, wherein the insulating material comprises a solid state material.

13. The photodetector array as claimed in claim 11, wherein the soft matter material comprises one or more of a group consisting of thiols, self assembled monolayers (SAMs), organic solvents, perfluoropolyether PFPE, organic solvents, and polymeric brushes.

14. The photodetector array as claimed in claim 12, wherein the solid state material comprises one or more of a group consisting of a dielectric material, or a doped heterostructure double well barrier such as $Al_xGa_{1-x}As/GaAs/Al_xGa_{1-x}As$.

15. The photodetector array as claimed in claim 8, wherein the spacer elements further maintain a parallelism of the pairs of first and second electrodes.

16. The photodetector array as claimed in claim 8, wherein the spacer elements are formed as separate solid state material spacers or are incorporated into the photo-sensitive material.

17. The photodetector array as claimed in claim 5, wherein the electrical circuit further comprises a multiplexer component for de-multiplexing electrical signals from the first and second sets of electrode wires for detecting the quantum tunneling currents between the opposing sections of the electrode wires of the first and second sets.

18. A method of generating an image comprising the steps of:
   providing a quantum tunneling photodetector array comprising:
      an array of pairs of opposing first and second electrodes, the array of opposing first and second electrodes comprising a cross-grid of a first set of electrode nano wires and a second set of electrode nano wires, such that the first and second electrodes are constituted as opposing sections of the electrode nano wires of the first and second sets at projected cross-points of the cross-grid, a photo-sensitive insulating material disposed between the opposing first and second electrodes of the respective pairs, and an electrical circuit for detecting photo-assisted quantum tunneling currents between the opposing first and second electrode of the respective pairs;

detecting photo-assisted quantum tunneling currents between opposing first and second electrodes of respective ones of the array of pairs of the opposing first and second electrodes; and generating the image based on the respective detected photo-assisted tunneling currents between the opposing first and second electrodes.

\* \* \* \* \*